United States Patent [19]

Pham

[11] Patent Number: 4,703,204
[45] Date of Patent: Oct. 27, 1987

[54] LOGIC COINCIDENCE GATE AND LOGIC SEQUENTIAL CIRCUITS USING SAID COINCIDENCE GATE

[75] Inventor: Ngu T. Pham, Paris, France

[73] Assignee: Thomson-CSF, Paris, France

[21] Appl. No.: 807,731

[22] Filed: Dec. 11, 1985

[30] Foreign Application Priority Data

Dec. 14, 1984 [FR] France ............................... 84 19194

[51] Int. Cl.$^4$ ................... H03K 19/017; H03K 19/02; H03K 19/094; H03K 19/092
[52] U.S. Cl. ................................... 307/448; 307/446; 307/450; 307/475
[58] Field of Search ............... 307/475, 446, 448, 443, 307/450

[56] References Cited

U.S. PATENT DOCUMENTS

| | | | |
|---|---|---|---|
| 3,664,118 | 5/1972 | Walton | 377/47 |
| 3,832,574 | 8/1974 | Leehan | 307/448 |
| 3,943,379 | 3/1976 | McGuffin | 377/47 |
| 4,450,369 | 5/1984 | Schuermeyer | 307/450 |

FOREIGN PATENT DOCUMENTS

| | | |
|---|---|---|
| 2410914 | 6/1979 | France . |
| 2502868 | 10/1982 | France ................................. 377/47 |

OTHER PUBLICATIONS

Van Tuyl et al., "High-Speed GaAs MSI", Hewlett-Packard Laboratories ISSCC76/Wednesday, 2/18/76.
Eden et al., "The Prospects for Ultrahigh-Speed VLSI GaAs Digital Logic, IEEE Journal, vol. SC-14, No. 2, 4/79.

Primary Examiner—Stanley D. Miller
Assistant Examiner—M. R. Wambach
Attorney, Agent, or Firm—Oblon, Fisher, Spivak, McClelland & Maier

[57] ABSTRACT

The invention relates to a coincidence gate, whose output only changes state if the inputs are of the same logic level. It has two parallel-connected NOT circuits, each constituted by a transistor, whose source is at earth and the drain supplied by a resistor, the gates constituting the inputs of the gate. The two resistors are identical saturated resistors and the first NOT circuit is supplied from a fixed voltage, whereas the second NOT circuit is supplied across a Schottky diode connected in the forward direction from the point common to the first saturated resistor and to the drain of the first transistor. The point common to the Schottky diode and the second saturated resistor constitutes the output of the coincidence gate. Application to sequential logic circuits.

9 Claims, 5 Drawing Figures

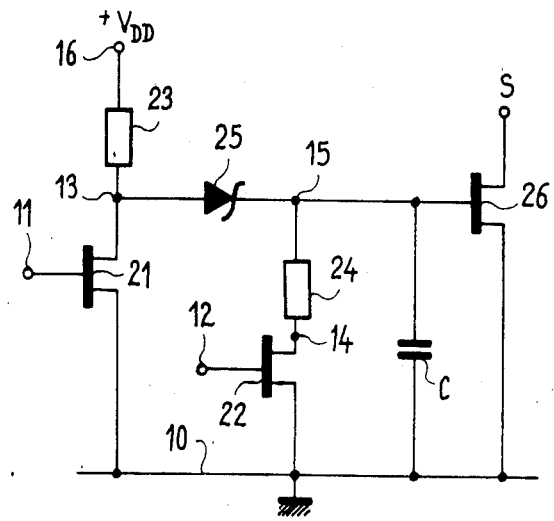
FIG_1
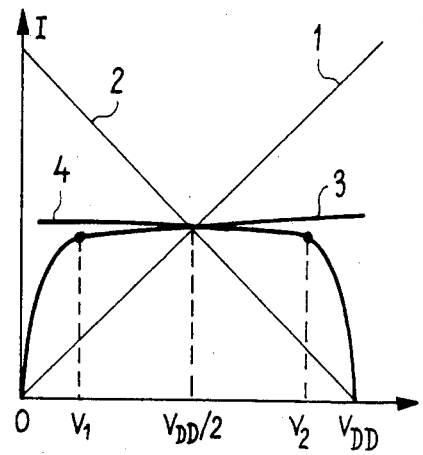
FIG_2
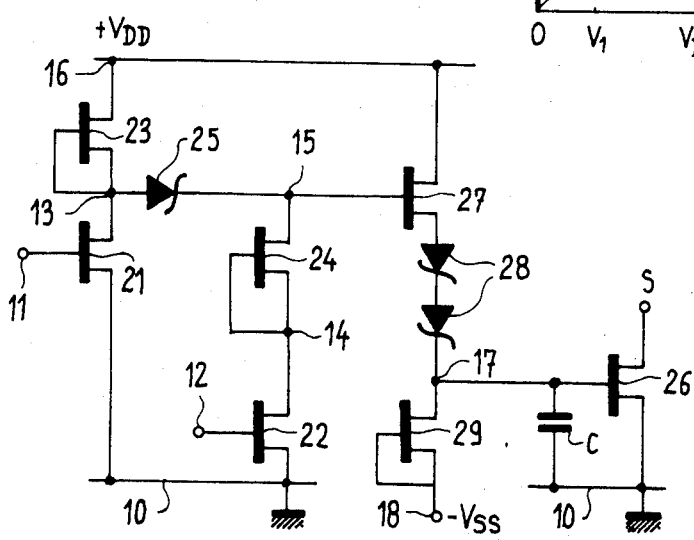
FIG_5

FIG_3
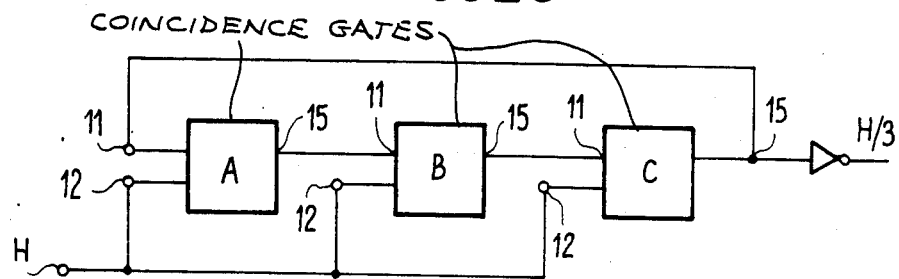
FIG_4
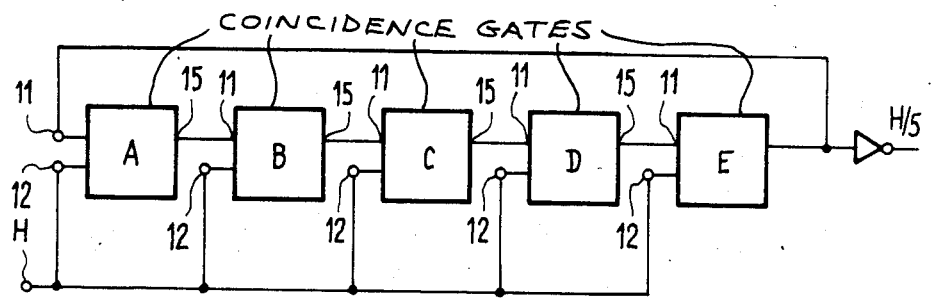

LOGIC COINCIDENCE GATE AND LOGIC SEQUENTIAL CIRCUITS USING SAID COINCIDENCE GATE

BACKGROUND OF THE INVENTION

The present invention relates to fast logic sequential circuits and more particularly to logic coincidence gates with two inputs. It uses either field effect transistors of the normally-on or normally-off types, or bipolar transistors, as a function of the logic circuit type in which the coincidence gate according to the invention is used. However, the dynamic characteristics of the coincidence gate lead to it being used in preferred manner in fast integrated circuits, such as those produced on GaAs or more generally on materials of group III–V.

The invention also relates to circuits using the coincidence gate, particularly frequency divider circuits or shift registers, or also frequency generators with a variable frequency.

The term coincidence or unanimous decision gate is used for a logic gate having at least two inputs, which must be simultaneously activated by logic levels, so that the output of the coincidence gate changes state. The known gates switch solidly and rapidly as a function of the logic signals applied to the inputs. The coincidence gate according to the invention only changes state if the two inputs are activated by the same logic levels (coincidence). In the opposite case (anticoincidence), the gate retains its previous state.

It has two parallel-connected transistors, where the gates, in the case of field effect transistors, constitute the inputs of the coincidence gate. The source of each transistor is grounded and it is supplied by its drain across a resistor. The special feature of the gate according to the invention is that the supply voltages differ for the two transistors. The first transistor is supplied across a first high value saturated resistor from a voltage $+V_{DD}$. The second transistor is also supplied across a second saturated resistor, which is identical to the first, but its supply voltage is taken, across a Schottky diode connected in the forward direction i.e., a conductive orientation, at the common point between the first saturated resistor and the first transistor drain. The output of this coincidence gate is sampled at the common point between the Schottky diode and the second saturated resistor and is applied to the gate of a third load resistor of capacitance C. In addition, the supply voltage $V_{DD}$ is high compared with the sum $V_H+V_D$, $V_H$ being the high level voltage at the output of the coincidence gate and $V_D$ the voltage drop across the diode in the on state.

What has been stated hereinbefore can be translated into terms of bipolar transistors by replacing the source, gate and drain by the emitter, base and collector respectively.

SUMMARY OF THE INVENTION

The present invention more specifically relates to a logic coincidence gate having two parallel-connected transistors, whereof the sources are grounded, whereof the gates constitute the inputs of the logic gate and whereof the drains are connected in each case to a resistor, wherein the resistors are identical saturated resistors and wherein the first saturated resistor and the first transistor are supplied from a fixed voltage source, whereas the second saturated resistor and the second transistor are supplied across a Schottky diode, connected in the conductive sense, from the common point of the first saturated resistor and the drain of the first transistor, the common point of the Schottky diode and the second saturated resistor constituting the output of the logic coincidence gate.

BRIEF DESCRIPTION OF THE DRAWINGS

The invention is described in greater detail hereinafter relative to non-limitative embodiments and the attached drawings, wherein show:

FIG. 1: A circuit diagram of the coincidence gate in a direct coupled FET logic or DCFL configuration, according to this invention.

FIG. 2: Are intensity curves as a function of the voltage for two saturated resistors explaining the operation of the gate of FIG. 1.

FIGS. 3 and 4: Are symbolic diagrams of two frequency dividers, produced with several gates according to the invention.

FIG. 5: Is a circuit diagram of the coincidence gate according to the invention, in a buffered FET logic or BFL configuration.

DETAILED DESCRIPTION OF THE PREFERRED EMBODIMENTS

In order to simplify the text and drawings, the invention will be described on the basis of field effect transistors, without in any way limiting the scope of the invention, which is also applicable to bipolar transistors.

In a logic circuit, switching is essentially a phenomenon of charging or discharging a capacitor, equivalent to the gate capacitance of a transistor and to the capacitances associated in the circuit and symbolized by C in FIGS. 1 and 5. The switching times are of form $$T = \frac{C \cdot \Delta V}{I}$$

in which:
C = the capacitance of the gates of the transistors of the circuit,
$\Delta V$ = excursion of the logic voltages,
I = charging current of capacitor C.

It is also possible to act on the switching time or response time of a logic gate by acting on current I.

Consideration will now be given to the logic gate according to the invention and shown in FIG. 1. The latter relates to field effect transistors of the normally-off type, with a positive threshold voltage and supplied from a single positive voltage $+V_{DD}$ relative to grounded, as well as to bipolar transistors.

The coincidence gate has two parallel-connected transistors 21, 22, whose sources are connected to grounded 10 and whose gates 11 and 12 respectively constitute the inputs of the coincidence gate. The first transistor 21 is supplied by its drain 13 across a first saturated resistor 23 and the second transistor 22 is supplied by its drain 14 across a second saturated resistor 24. However, the first saturated resistor or load 23 is supplied by a positive voltage 16 $+V_{DD}$, whereas the second saturated resistor or load 24 is supplied, across a Schottky diode 25, from the common point 13 of the first saturated resistor 23 and the drain of the first transistor 21. Schottky diode 25 is connected in the forward direction, passing from the first to the second saturated resistor.

The output of said gate is sampled at point 15, which is common to Schottky diode 25 and to the second saturated resistor 24 and is applied to a charging circuit symbolized by a capacitor C and by a transistor 26.

This coincidence gate is of the DCFL type, because the first stage constituted by transistor 21 and the saturated load 23, with its output to the common point 13 between the two, is already a DCFL gate.

In order for said coincidence gate to function well it is necessary for the supply voltage $+V_{DD}$ to be very high compared with the sum of the output level $V_H$ at point 15 and the voltage drop $V_D$ in diode 25

$$V_{DD} >> V_H + V_D$$

and for the two saturated resistors 23, 24 to be identical, of high value and with a low knee voltage (i.e., the break in a diodes I-V characteristic).

The term saturated load or resistor is used to define devices, whereof the law of variation of the resistance (or the intensity passing through them) is not linear as a function of the voltage applied and consequently is not in accordance with Ohm's law V=RI. Thus, saturated resistors are constituted by gate-less grooved channel transistors, transistors whose gate is connected to the source and gate-less transistors having holes in the thickness of the active layer.

The following table defines the operating sequences of the coincidence gate according to the invention and the following explanations are given with respect thereto:

1 = high logic level, $V_H$ or logic 1,
0 = low logic level, or logic 0 (because there is only a single positive supply voltage),
$V_d$ = low logic level or waste voltage of the first transistor 21 loaded by resistor 23,
$V_D$ = voltage drop across Schottky diode 25 in the conductive state,
T = state change time of the gate, when said state is unstable.

| Sequence | 1st gate 11, input | 2nd gate 12, input | Voltage at 13 | State at 15, output | T |
|---|---|---|---|---|---|
| 1 | 1 | 1 | $V_d$ | 0 | |
| 2 | 1 | 0 | $V_d$ | 0 | $\frac{C\Delta V}{0}$ |
| 3 | 0 | 0 | $V_H + V_D$ | 1 | |
| 4 | 0 | 1 | $V_H + V_D$ | 1 | $\frac{C\Delta V}{I_{24} - I_{23}}$ |
| 5 | 1 | 1 | $V_d$ | 0 | |
| 6 | 0 | 1 | $V_D$ | 0 | $\frac{C\Delta V}{I_{23} - I_{24}}$ |
| 7 | 0 | 0 | $V_H + V_D$ | 1 | |
| 8 | 1 | 0 | $V_d$ | 1 | $\frac{C\Delta V}{0}$ |
| 9 | 1 | 1 | $V_d$ | 0 | |

For the coincidence gate according to the invention, the states of the uneven sequences are stable, like those of a normal NOR gate, whereas the states of the even sequences are more or less unstable. Moreover, in these sequences, it is remarkable that there is a cycle in which sequences 1, 5 and 9 are identical (i.e., identical input values produce identical results).

Sequence 1: the two transistors are conductive, i.e. drain 13 of transistor 21 is at its waste voltage $V_d$, but as $V_d < V_D$, diode 25 does not conduct and output 15 is at low state 0.

Sequence 2: transistor 22 has been rendered nonconductive diode 25 isolates the output and there is substantially no current for charging or discharging capacitor C. State 2 is quasi-stable and the gate does not switch. The switching time $C\Delta V/O$ is infinite.

Sequence 3: the two transistors 21, 22 are off and collector 13 is brought to a voltage $V_H + V_D$, because the assembly of load transistor 26, diode 25 and saturated resistor 23 acts like a voltage divider, so that the voltage at 13 is equal to the high level voltage $V_H$ of transistor 26, plus the voltage drop $V_D$ of diode 25. The gate switches to logic level 1 at its output 15.

Sequence 4: transistor 22 which has become conductive tends to bring output 15 to 0, which is the potential of earth 10, but the saturated resistor 24 limits the current in transistor 22, so that switching becomes very slow, with a switching time:

$$T = \frac{C\Delta V}{I_{24} - I_{23}} \text{ and } I_{24} \simeq I_{23}$$

During this sequence, drain 13 remains at voltage $V_H + V_D$, as hereinbefore. To understand it, reference should be made to FIG. 2, which gives the comparative intensity curves as a function of the voltage for two linear resistors and two saturated resistors. For the two linear resistors, curves 1 and 2 are straight lines respecting Ohm's law and if the voltage drops, the current drops in proportion thereto. However, for the two saturated resistors, the curves 3 and 4 have a bend or knee and the intensity no longer increases with the voltage following said knee and there is saturation. Consequently, between two voltages arbitrarily designated $V_1$ and $V_2$ between 0 and $V_{DD}$ the intensity remains substantially constant, no matter what the voltage. It has been said that $V_{DD}$ is very high compared with $V_H$, so that the voltage at drain 13 is beyond the knee and remains equal to $V_H + V_D$ as in the preceding sequence. Output 15 does not switch and is at a logic 1.

Sequence 5: it is identical to the first sequence and output 15 switches to logic 0.

Sequence 6: transistor 21 is off and tends to bring output 15 to $V_H$, as a result of current $I_{22}$ passing through the saturated resistor 23. However, as transistor 22 is conductive, the current $I_{24}$ passing through the saturated resistor 24 opposes the effect of current $I_{23}$ and the state change time is:

$$T = \frac{C \cdot \Delta V}{I_{23} - I_{24}} \text{ and } I_{23} \simeq I_{24}$$

said time being very long and the flip-flop does not switch.

Sequence 7: it is identical to the second sequence. As the two transistors are off, point 13 rises to $V_H + V_D$ and output 15 switches to logic 1.

Sequence 8: transistor 21 is conductive and brings point 13 to its waste voltage $V_d$. Transistor 22 is off and as the Schottky diode 25 brings about a good isolation of capacitor C, there is substantially no charging or discharging current. Output 15 remains at the high logic state 1 and the gate does not switch. The state is quasi-stable.

Sequence 9: it is identical to the first sequence. A new cycle starts.

This logic gate behaves like a coincidence NOR gate and there is a change of state if the inputs are identical. If the inputs differ, the output retains its previous state.

FIG. 3 which is a block diagram shows a first example of the application of said coincidence gate and it is a frequency divider by 3. It has three coincidence gates in series, represented in the form of the block diagrams A, B and C in this figure. The output 15 of one stage is connected to the input 11 of the first transistor 21 of the following stage and the output 15 of the final stage is looped on to the input of the first stage. Inputs 12 of the second transistors 22 of each stage are joined together in a single input of the divider, to which is applied a frequency signal, which can be looked upon as a clock signal H. The divider output is sampled following a NOT circuit connected to the output 15 of the final stage. The NOT circuit supplies a frequency H/3.

The following table give the operating sequences of the divider. In this table, the state column gives the state of a coincidence gate in accordance with the sequences of the previous table, e.g. A1 B6 C4 means that gate A is in the state of sequence 1, gate B in the state of sequence 6 and gate C in the state of sequence 4.

| Sequence | H | Input of A/output of C | Input of B/output of A | Input of C/output of B | States of A | B | C |
|---|---|---|---|---|---|---|---|
| 1 | 1 | 0 | 0 | 1 | 1 | 6 | 4 |
| 2 | 0 | 0 | 1 | 1 | 2 | 3 | 8 |
| 3 | 1 | 0 | 1 | 0 | 6 | 4 | 1 |
| 4 | 0 | 1 | 1 | 0 | 3 | 8 | 2 |
| 5 | 1 | 1 | 0 | 0 | 4 | 1 | 6 |
| 6 | 0 | 1 | 0 | 1 | 8 | 2 | 3 |
| 7 | 1 | 0 | 0 | 1 | A1 | B6 | C4 |

Sequence 7 returns to sequence 1. This table can easily be understood by applying to each gate and for each sequence, the law imposed by the first table of sequences and bearing in mind that the uneven states are stable, whereas the even states are quasi-stable. On the basis of the above table, the succession of states follows the order 1-2-6-3-4-8 of the sequences of the first table. It can be seen that each output of coincidence gate A, B or C remains in the same state for 3 clock steps or, which amounts to the same thing, during 3 sequences, so that this circuit is a frequency divider by 3.

The stability of the even states 2, 4 and 6 determines the lower operating limits of the divider. The upper limits of the operating frequencies are fixed by the switching times of the uneven states, equivalent to those of a gate with a fan-out of 1, i.e. the minimum time of a logic NOT circuit. The upper operating frequency limits of these dynamic dividers are consequently very high, e.g. for a minimum time of 15 picoseconds, the limit frequency is above 30 GHz.

FIG. 4 shows a second example of a frequency divider using the coincidence gate according to the invention. It is a frequency divider by 5 using 5 coincidence gates A, B, C, D, E, connected in series in the same way as the previous divider, only the series being longer.

This frequency divider by 5 operates in accordance with the following table of sequences, which can be understood on the basis of the table of sequences relative to a coincidence gate.

| Sequence | H | Inputs of: A | B | C | D | E | States of: A | B | C | D | E |
|---|---|---|---|---|---|---|---|---|---|---|---|
| 1 | 1 | 0 | 0 | 1 | 0 | 1 | 1 | 6 | 4 | 1 | 4 |
| 2 | 0 | 0 | 1 | 1 | 0 | 1 | 2 | 3 | 4 | 2 | 3 |
| 3 | 1 | 0 | 1 | 0 | 0 | 1 | 1 | 4 | 1 | 6 | 4 |
| 4 | 0 | 0 | 1 | 0 | 1 | 1 | 2 | 3 | 2 | 3 | 8 |
| 5 | 1 | 0 | 1 | 0 | 1 | 0 | 6 | 4 | 1 | 4 | 1 |
| 6 | 0 | 1 | 1 | 0 | 1 | 0 | 3 | 8 | 2 | 3 | 2 |
| 7 | 1 | 1 | 0 | 0 | 1 | 0 | 4 | 1 | 6 | 4 | 1 |
| 8 | 0 | 1 | 0 | 1 | 1 | 0 | 3 | 2 | 3 | 8 | 2 |
| 9 | 1 | 1 | 0 | 1 | 0 | 0 | 4 | 1 | 4 | 1 | 6 |
| 10 | 0 | 1 | 0 | 1 | 0 | 1 | 8 | 2 | 3 | 2 | 3 |
| 11 | 1 | 0 | 0 | 1 | 0 | 1 | 1 | 6 | 4 | 1 | 4 |

As in the previous tables, the uneven states are stable and the even states quasi-stable. It can be seen that the state of a gate does not switch during sequences, so that said circuit is a frequency divider by 5, whose maximum frequency is given by $\frac{1}{2}T_{min}$, $T_{min}$ being the minimum switching time of a gate.

In more general terms, the coincidence gate according to the invention makes it possible to use frequency dividers of order 2n+1 (uneven) with 2n+1 series-connected gates according to FIG. 3 or 4.

Thus, FIG. 4 can function in a different way as a frequency generator with a variable frequency. For this purpose it is merely necessary to apply a d.c. voltage to inputs 12 and not a sinusoidal or square wave signal H. The coincidence gate according to the invention then becomes a logic NOT circuit with an input at 11 operating according to the so-called low pinch-off voltage FET logic or LPFL logic. The circuit of FIG. 4, or another drawing having a different uneven number of gates, is in a condition for oscillating, because consideration has been given hereinbefore to the fact that there are unstable states, but which are called quasi-stable due to their very long switching time.

The not shown response curve of such an oscillator is a Gaussian curve of the frequency when the voltage applied to input 12 passes from a certain threshold, which is dependent on the technology of the transistors, to the maximum, equal to logic 1, in order that oscillation ceases. Consequently, by applying a voltage above the threshold voltage to input 12, it is possible to control the oscillating frequency of said circuit and make it vary.

FIG. 1 and those based thereon relates to a gate produced with normally-off or bipolar transistors supplied from a single voltage source $V_{DD}$.

FIG. 5 gives a diagram of this coincidence gate when the transistors used are normally-on. This circuit is supplied from two voltage sources $+V_{DD}$ and $-V_{SS}$ and is in BFL logic.

The normally-on transistors with a negative threshold voltage are easier to realize than normally-off transistors with a positive threshold voltage and have higher operating frequencies, which makes it possible to obtain faster circuits. However, they have a higher consumption level than normally-off transistors.

The left-hand part of FIG. 5 is in all points comparable with FIG. 1 and only the saturated loads are represented differently by transistors, whose gate is connected to the source.

Output 15 of said coincidence gate is connected to a voltage shifter, constituted by a transistor 27, supplied by $+V_{DD}$ and whose source is supplied by a negative voltage $-V_{SS}$ across two Schottky diodes 28 and a saturated load 29. The common point 17 to the saturated load 29 and to the final Schottky diode 28 constitutes the output of said BFL circuit, charged by a circuit symbolized by a transistor 26 and a capacitor C. Such a voltage shifter is known and serves to supply negative output levels.

The operation of this coincidence gate is identical to that of the gate of FIG. 1 and it is merely necessary to replace, in the table of sequences, the level 0 by low logic levels $V_B$ designating a negative voltage, because the transistors are at negative threshold voltage.

The following table is drawn therefrom:

| Sequence | 1st gate 11, input | 2nd gate 12, input | Voltage at 15 | State at 17, output | T |
|---|---|---|---|---|---|
| 1 | $V_H$ | $V_H$ | 0 | $V_B$ | |
| 2 | $V_H$ | $V_B$ | 0 | $V_B$ | $\frac{C' + \Delta V'}{0}$ |
| 3 | $V_B$ | $V_B$ | $V_H + \Delta$ | $V_H$ | |
| 4 | $V_B$ | $V_H$ | $V_H + \Delta$ | $V_H$ | $\frac{C' + \Delta V'}{I_{24} - I_{23}}$ |
| 5 | $V_H$ | $V_H$ | 0 | $V_B$ | |
| 6 | $V_B$ | $V_H$ | 0 | $V_B$ | $\frac{C' + \Delta V'}{I_{23} - I_{24}}$ |
| 7 | $V_B$ | $V_B$ | $V_H + \Delta$ | $V_H$ | |
| 8 | $V_H$ | $V_B$ | $V_H + \Delta$ | $V_H$ | $\frac{C' + \Delta V'}{0}$ |
| 9 | $V_H$ | $V_H$ | 0 | $V_B$ | |

The following meanings are used in the table:
$V_H$=high logic level (logic 1)
$V_B$=low logic level (logic 0)
C'=capacitance at 15
$\Delta$=voltage shift between 15 and 17
$\Delta V'=V_H+\Delta$=voltage excursion of point 15.

This coincidence gate with normally-on transistors functions like the gate with normally-off transistors of FIG. 1 and consequently has the same applications in dynamic frequency dividers of uneven rank 2n+1 or in frequency generators with variable frequencies.

In more general terms, the coincidence gate according to the invention is applied in fast logic, more particularly in fast integrated circuits on materials such as GaAs or similar compounds of group III-V.

The invention is not limited to the embodiments described and covers all technical equivalents and their combinations if they are within the scope of the invention and within the framework of the following claims.
9n

What is claimed is:

1. A logic coincidence gate comprising: two first and second transistors, where both sources are grounded and where the gates of said first and second transistors constitute the inputs of said logic gate and where the drains of each of said first and second transistors are connected to first and second resistors, wherein said first and second resistors are identical saturated resistors and wherein the first saturated resistor and said first transistor are supplied from a fixed voltage source, and further where the second saturated resistor and said second transistor are supplied across a Schottky diode, connected in a conductive sense, from the common point of the first saturated resitor and the drain of the first transistor, the common point of the Schottky diode and the second saturated resistor constituting the output of the logic coincidence gate.

2. A logic coincidence gate according to claim 1, wherein the saturated resistors have a low knee voltage.

3. A logic coincidence gate according to claim 1, wherein the saturated resistors are constituted by a depletion transistor, whose gate is connected to the source, or by a grooved channel transistor without gate metallization, or by a gate-less transistor having holes in the active layer.

4. A logic coincidence gate according to claim 1, wherein the transistors are of the normally-off field effect type with a positive threshold voltage.

5. A logic coincidence gate according to claim 1, wherein the transistors are of the normally-on field effect type with a negative threshold voltage, the logic coincidence gate having in this case a voltage shifting stage constituted by a third transistor having a drain connected to said fixed voltage source, whose gate is connected to the output of the logic coincidence gate and whose source is connected to a negative voltage across shift diodes and a saturated resistor, the common point of said shift diodes and the saturated resistor constituting the output of said logic gate.

6. A logic coincidence gate according to claim 1, wherein the transistors are bipolar transistors, whose bases constitute the gate inputs.

7. A logic sequential circuit forming a frequency divider of uneven order (2n+1), wherein it has a plurality (2n+1) of logic gates according to claim 1, which are connected in series, the output of one gate being connected to the first input of the following gate, the output of the final gate also constituting the output of the sequential circuit being connected on to the first input of the first gate and the second inputs of the logic gates being interconnected and constitute the input of the sequential circuit, to which is applied an input signal, whose frequency is divided at the output by 2n+1.

8. A sequential logic circuit forming a frequency generator with a variable frequency, wherein it is constituted by a sequential logic circuit according to claim 7, to whose input is applied a d.c. voltage, the frequency at the output of said generator being a function of the d.c. voltage applied to the input.

9. A logic coincidence gate comprising:
first and second transistors each having a source, a drain and a gate connection wherein both of said source connections are grounded;
first and second identical saturation resistors each having a first and second end and each having their respective first ends coupled to the drain connections of each of said first and second transistors;
a fixed voltage source coupled to said second end of said first saturated resistor and said first transistor for supplying a fixed voltage;
a Schottky diode connected in a conductive manner from the common point of said first saturated resistor and said first transistor to said second end of said second saturated resistor and said second transistor; and
wherein the gates of said transistors constitute the input of said logic gate and the output of said logic gate is constituted by the common point of said Schottky diode and said second saturated resistor.

* * * * *